(12) United States Patent
Furukawa et al.

(10) Patent No.: US 11,102,865 B2
(45) Date of Patent: Aug. 24, 2021

(54) LIGHTING CONTROL CIRCUIT

(71) Applicant: Panasonic Intellectual Property Management Co., Ltd., Osaka (JP)

(72) Inventors: Satoshi Furukawa, Osaka (JP); Kiminori Shimizu, Osaka (JP); Yusuke Shimogaki, Osaka (JP)

(73) Assignee: PANASONIC INTELLECTUAL PROPERTY MANAGEMENT CO. LTD, Osaka (JP)

( * ) Notice: Subject to any disclaimer, the term of this patent is extended or adjusted under 35 U.S.C. 154(b) by 0 days.

(21) Appl. No.: 17/054,254

(22) PCT Filed: Jul. 2, 2019

(86) PCT No.: PCT/JP2019/026213
§ 371 (c)(1),
(2) Date: Nov. 10, 2020

(87) PCT Pub. No.: WO2020/059244
PCT Pub. Date: Mar. 26, 2020

(65) Prior Publication Data
US 2021/0112643 A1    Apr. 15, 2021

(30) Foreign Application Priority Data
Sep. 19, 2018 (JP) .............................. JP2018-175181

(51) Int. Cl.
*H05B 45/48* (2020.01)
*H05B 47/14* (2020.01)

(52) U.S. Cl.
CPC ............. *H05B 45/48* (2020.01); *H05B 47/14* (2020.01)

(58) Field of Classification Search
None
See application file for complete search history.

(56) References Cited

U.S. PATENT DOCUMENTS

2014/0184076 A1 * 7/2014 Murphy ................. H05B 45/14
                                                        315/121
2017/0223805 A1   8/2017 Kosugi et al.

FOREIGN PATENT DOCUMENTS

| JP | 50-54083 U    | 5/1975 |
| JP | 3-223932 A    | 8/1996 |
| JP | 2017-139207 A | 8/2017 |

OTHER PUBLICATIONS

International Search Report w/English translation and Written Opinion in Japanese dated Aug. 6, 2019, issued in counterpart International Application No. PCT/JP2019/026213 (7 pages).

* cited by examiner

*Primary Examiner* — Dedei K Hammond
(74) *Attorney, Agent, or Firm* — Westerman, Hattori, Daniels & Adrian, LLP (57) ABSTRACT

A lighting control circuit includes: a light-emitting element which includes a first terminal and a second terminal; a first shunt resistance element which is connected in parallel to the light-emitting element between the first terminal and the second terminal; and a control circuit which turns, into a conducting state, a first current path extending between the first terminal and the second terminal via the first shunt resistance element when a potential difference between the first terminal and the second terminal is greater than a first threshold value and turns, into a non-conducting state, the first current path when the potential difference is smaller than the first threshold value.

4 Claims, 9 Drawing Sheets

LIGHTING CONTROL CIRCUIT

TECHNICAL FIELD

The present invention relates to a lighting control circuit which controls a lighting state.

BACKGROUND ART

Technologies of controlling a lighting state have been conventionally known (for example, refer to Patent Literatures 1 and 2).

CITATION LIST

Patent Literatures

PTL 1: Japanese Unexamined Patent Application Publication No. H08-223932
PTL 2: Japanese Unexamined Patent Application Publication No. 2017-139207

SUMMARY OF THE INVENTION

Technical Problem

As a result of a reduction in a voltage applied to a light-emitting element, the amount of light emitted from the light-emitting element decreases. Thus, it may be difficult to visually recognize the lighting state of the light-emitting element.

Thus, it is an object of the present invention to provide a lighting control circuit capable of suppressing a reduction in a voltage applied to a light-emitting element as a result of a reduction in a voltage applied to a light emitting circuit to thereby suppress a decrease in the amount of light emitted from the light-emitting element.

Solution to Problem

A lighting control circuit includes: a light-emitting element which includes a first terminal and a second terminal; a first shunt resistance element which is connected in parallel to the light-emitting element between the first terminal and the second terminal; and a control circuit which turns, into a conducting state, a first current path extending between the first terminal and the second terminal via the first shunt resistance element when a potential difference between the first terminal and the second terminal is greater than a first threshold value and turns, into a non-conducting state, the first current path when the potential difference is smaller than the first threshold value.

Advantageous Effect of Invention

With the lighting control circuit according to one aspect of the present disclosure, it is possible to suppress a reduction in a voltage applied to a light-emitting element as a result of a reduction in a voltage applied to a light-emitting circuit to thereby suppress a decrease in the amount of light emitted from the light-emitting element.

DESCRIPTION OF EXEMPLARY EMBODIMENTS

Background for Providing One Aspect of the Present Invention

A book-type servo amplifier typically used in Europe, etc., has part of a current path structured to be exposed to an outside. Thus, it is well-known that when an internal voltage of a circuit is greater than or equal to a dangerous voltage as a voltage dangerous for human bodies, alarm display is performed through light emission performed by a light-emitting element. In a case where such a book-type servo amplifier is used with a supply voltage of 400V, when the inner voltage of the circuit has reduced to nearly a dangerous voltage threshold value, the light amount of the light-emitting element remarkably reduces, thus leading to difficulties in visually recognizing a lighting state of the light-emitting element.

Thus, repeated studies have been done by the inventor in order to suppress a remarkable reduction in the light amount of the light-emitting element even upon a reduction in the inner voltage of the circuit in the book-type servo amplifier described above. As a result, the inventor has conceived of a lighting control circuit according to one aspect of the present disclosure below.

The lighting control circuit according to one aspect of the present disclosure includes: a light-emitting element which has a first terminal and a second terminal; a first shunt resistance element which is connected in parallel to the light-emitting element between the first terminal and the second terminal; and a control circuit which turns, into a conducting state, a first current path extending between the first terminal and the second terminal via the first shunt resistance element when a potential difference between the first terminal and the second terminal is greater than a first threshold value and turns the first current path into a non-conducting state when the potential difference is smaller than the first threshold value.

In the lighting control circuit described above, when a voltage applied to the light-emitting element reduces below the first threshold value, the first current path changes from the conducting state to the non-conducting state. Thus, the amount of a current flowing to the light-emitting element increases, compared to a case where the first current path is in the conducting state. As described above, with the lighting control circuit described above, the decrease in the amount of light emitted from the light-emitting element can be suppressed by suppressing the reduction in the voltage applied to the light-emitting element as a result of the reduction in the voltage applied to a light-emitting circuit.

Moreover, the control circuit described above includes: a detection circuit which detects the potential difference described above; and a first switch which switches between a first state as a conducting state and a second state as a non-conducting state and is serially connected to the first shunt resistance element on the first current path. The detection circuit may turn the first switch into the first state when the potential difference is greater than the first threshold value, and the detection circuit may turn the first switch into the second state when the potential difference is smaller than the first threshold value.

Moreover, further provided is a second shunt resistance element which is connected in parallel to the light-emitting element and the first shunt resistance element between the first terminal and the second terminal. The control circuit may turn, into a conducting state, a second current path extending between the first terminal and the second terminal via the second shunt resistance when the potential difference between the first terminal and the second terminal is greater than a second threshold value different from the first threshold value. The control circuit may turn the second current path into a non-conducting state when the potential difference is smaller than the second threshold value.

Moreover, the control circuit described above includes: a detection circuit which detects the potential difference; a first switch which is serially connected to the first shunt resistance element on the first current path and switches between a first state as a conducting state and a second state as a non-conducting state; and a second switch which is serially connected to the second shunt resistance element on the second current path and switches between a third state as a conducting state and a fourth state as a non-conducting state. The detection circuit may turn the first switch into the first state when the potential difference is greater than the first threshold value and may turn the first switch into the second state when the potential difference is smaller than the first threshold value. The detection circuit may turn the second switch into the third state when the potential difference is greater than the second threshold value and may turn the second switch into the fourth state when the potential difference is smaller than the second threshold value.

Hereinafter, a detailed example of the lighting control circuit according to one aspect of the present disclosure will be described with reference to the drawings. Note that the embodiments described below each illustrate the detailed example. Numerical values, shapes, components, arrangement and a connection mode of the components as well as steps, a sequence of the steps, etc., illustrated in the embodiments below each form just one example and are not intended to limit the present disclosure in any manner. Among the components in the embodiments below, those not described in an independent claim will be described as optional components. Moreover, each of the drawings is a schematic diagram and does not necessarily provide a precise illustration.

Embodiment 1

Hereinafter, one example of a lighting control circuit according to one aspect of the present disclosure will be described.

Figure 1:
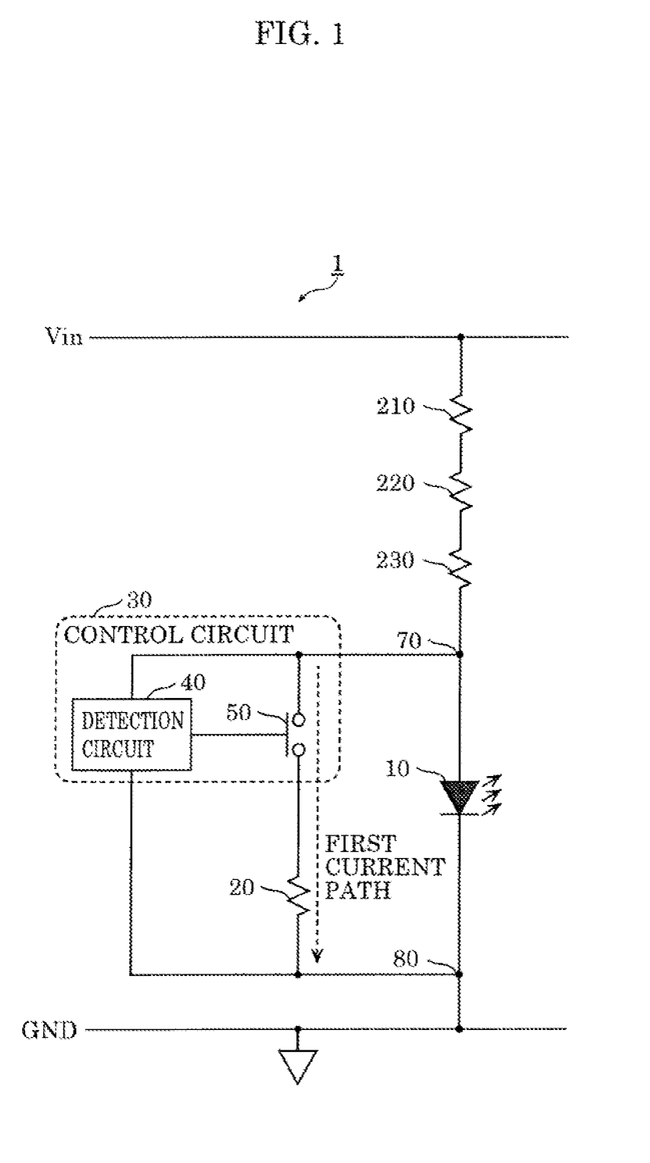
FIG. 1 is a circuit diagram illustrating a configuration of a lighting control circuit according to Embodiment 1.

FIG. 1 is a circuit diagram illustrating a configuration of lighting control circuit 1 according to Embodiment 1.

As illustrated in FIG. 1, lighting control circuit 1 includes: light-emitting element 10, first shunt resistance element 20, control circuit 30, and current limiting resistance element 210 to current limiting resistance element 230. It is illustrated here that lighting control circuit 1 includes current limiting resistance element 210 to current limiting resistance element 230, but current limiting resistance element 210 to current limiting resistance element 230 do not necessarily have to be included in lighting control circuit 1. For example, current limiting resistance element 210 to current limiting resistance element 230 may be included in an external circuit of lighting control circuit 1.

Light-emitting element 10 has first terminal 70 and second terminal 80 and emits light in accordance with the amount of a current flowing between first terminal 70 and second terminal 80 so that the light amount increases with an increase in the amount of current. Light-emitting element 10 is realized by a light emitting diode (LED) as one example.

First shunt resistance element 20 is connected in parallel to light-emitting element 10 between first terminal 70 and second terminal 80. First shunt resistance element 20 typically has a resistance value of several kilo ohms to several tens of kilo ohms.

When a potential difference between first terminal 70 and second terminal 80 is greater than a first threshold value, control circuit 30 turns, into a conducting state, a first current path extending between first terminal 70 and second terminal 80 via first shunt resistance element 20. When the potential difference between first terminal 70 and second terminal 80 is smaller than the first threshold value, control circuit 30 turns, into a non-conducting state, the first current path extending between first terminal 70 and second terminal 80 via first shunt resistance element 20.

As illustrated in FIG. 1, control circuit 30 includes detection circuit 40 and first switch 50.

First switch 50 is a switch which switches between a firsts state as a conducting state and a second state as a non-conducting state and is serially connected to first shunt resistance element 20 on the first current path.

Detection circuit 40 detects the potential difference between first terminal 70 and second terminal 80. When the detected potential difference is greater than the first threshold value, detection circuit 40 then turns first switch 50 into the first state. When the detected potential difference is smaller than the first threshold value, detection circuit 40 turns first switch 50 into the second state.

Current limiting resistance element 210 to current limiting resistance element 230 are serially connected between a power source Vin and first terminal 70. Current limiting resistance element 210 to current limiting resistance element 230 typically have resistance elements each having a resistance value of several hundreds of kilo ohms.

Hereinafter, the operation of lighting control circuit 1 with the configuration described above will be described.

Hereinafter, it will be described that the potential difference between first terminal 70 and second terminal 80 serves as the first threshold value when the potential of the power source Vin with respect to a ground GND is 150V. Moreover, it will be described below that detection circuit 40 turns first switch 50 into the first state (conducting state) when the potential difference between first terminal 70 and second terminal 80 is greater than or equal to the first threshold value. It will also be described that detection circuit 40 turns first switch 50 into the second state (non-conducting state) when the potential difference between first terminal 70 and second terminal 80 is less than the first threshold value.

Figure 2:
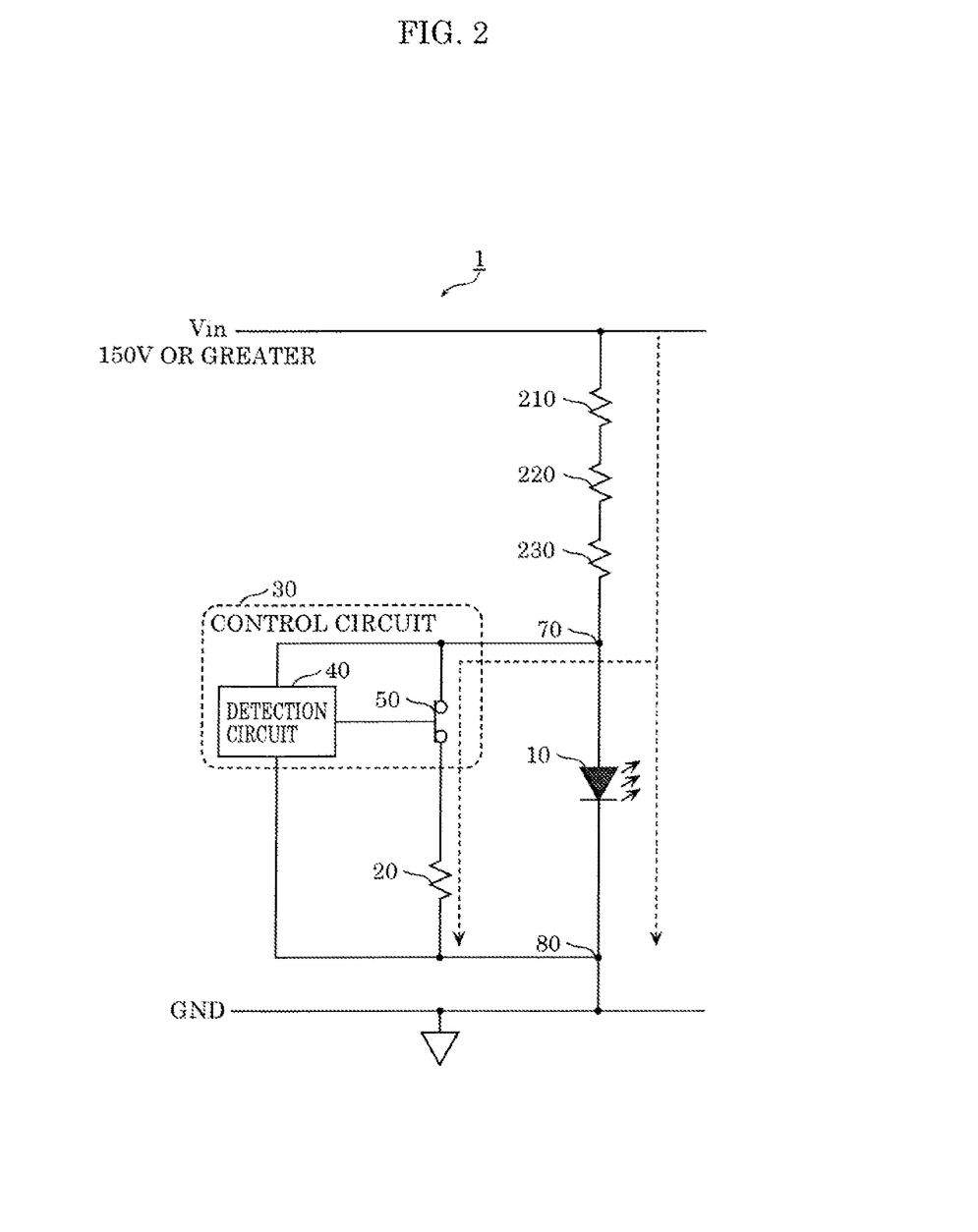
FIG. 2 is a schematic diagram illustrating a main current path when the potential of a power source Vin is 150V or greater, in Embodiment 1.

FIG. 2 is a schematic diagram illustrating a main current path flowing between the power source Vin and the ground GND when the potential of the power source Vin with respect to the ground GND is 150V or greater.

Figure 3:
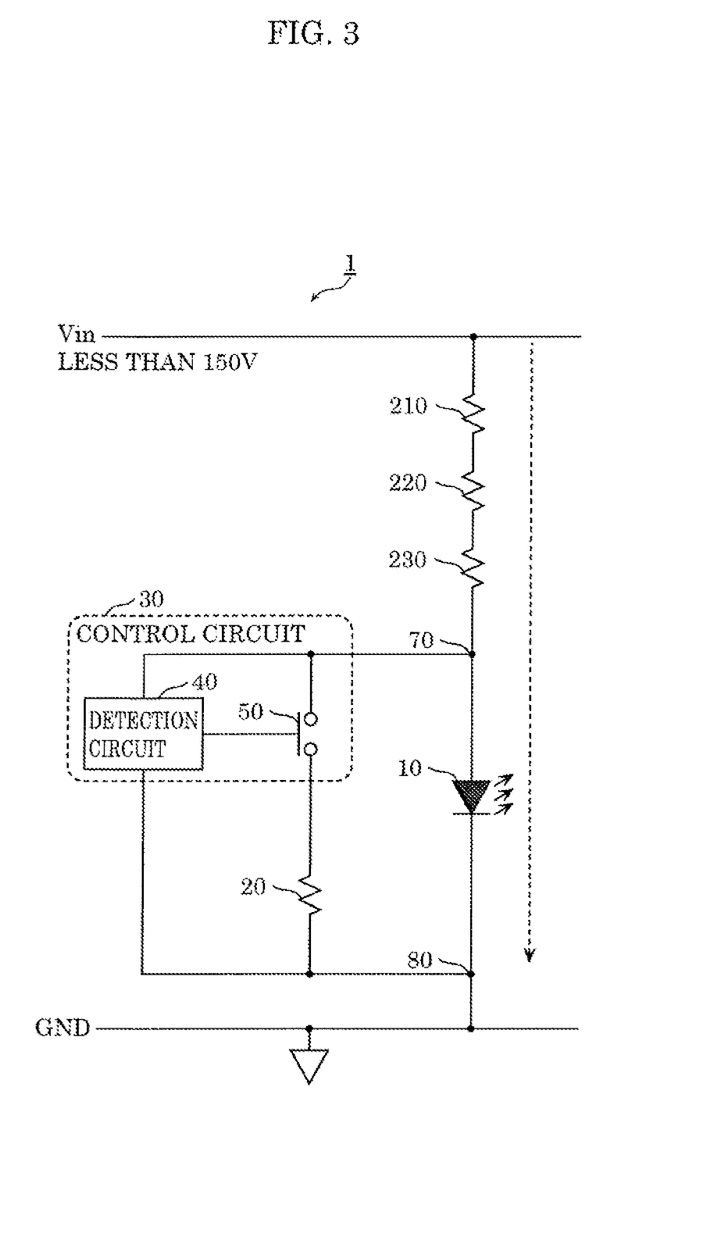
FIG. 3 is a schematic diagram illustrating a main current path when the potential of the power source Vin is less than 150V, in Embodiment 1.

FIG. 3 is a schematic diagram illustrating a main current path flowing between the power source Vin and the ground GND when the potential of the power source Vin with respect to the ground GND is less than 150V.

Figure 4:
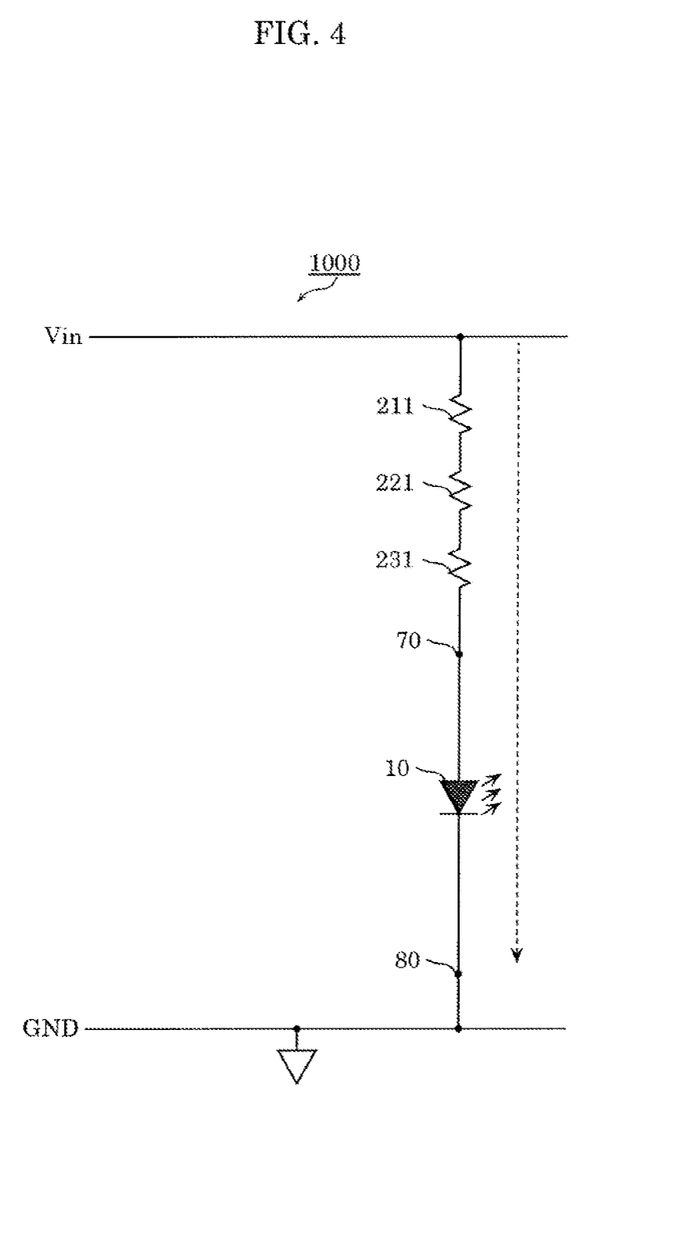
FIG. 4 is a circuit diagram illustrating a configuration of a lighting control circuit of a conventional type in a comparative example.

FIG. 4 is a circuit diagram illustrating a configuration of lighting control circuit 1000 of a conventional type in a comparative example which is configured such that control circuit 30 and first shunt resistance element 20 are eliminated from lighting control circuit 1 and current limiting resistance element 210 to current limiting resistance element 230 are respectively changed to current limiting resistance element 211 to current limiting resistance element 231.

In lighting control circuit 1, when the potential of the power source Vin with respect to the ground GND is 150V or greater, the potential difference between first terminal 70 and second terminal 80 is greater than or equal to the first threshold value, so that first switch 50 turns into a conducting state. Thus, as illustrated in FIG. 2, a main current between first terminal 70 and second terminal 80 flows while divided into a current path (that is, the first current path) passing through first switch 50 and first shunt resistance element 20 and a current path passing through light-emitting element 10.

In lighting control circuit 1, when the potential of the power source Vin with respect to the ground GND is less than 150V, the potential difference between first terminal 70 and second terminal 80 is less than the first threshold value, so that first switch 50 turns into a non-conducting state. Thus, as illustrated in FIG. 3, the main current between first terminal 70 and second terminal 80 consequently flows through only the current path passing through light-emitting element 10 without divided into the current path (that is, the first current path) passing through first switch 50 and first shunt resistance element 20.

Therefore, when transition occurs from a state in which the potential of the power source Vin with respect to the ground GND is 150V or greater to a state in which the potential of the power source Vin with respect to the ground GND is less than 150V, the amount of the current flowing to light-emitting element 10 increases in the state after the transition than in the state before the transition. That is, the light amount of light-emitting element 10 increases in the state after the transition than in the state before the transition.

On the contrary, in lighting control circuit 1000 of a conventional type in the comparative example, the main current between first terminal 70 and second terminal 80 flows only to the current path passing through light-emitting element 10 regardless of the potential of the power source Vin with respect to the ground GND. Thus, the amount of the current flowing to light-emitting element 10 monotonously decreases following a reduction in the positional of the power source Vin with respect to the ground GND. That is, the light amount of light-emitting element 10 monotonously decreases following the reduction in the potential of the power source Vin with respect to the ground GND in lighting control circuit 1000.

Figure 5:
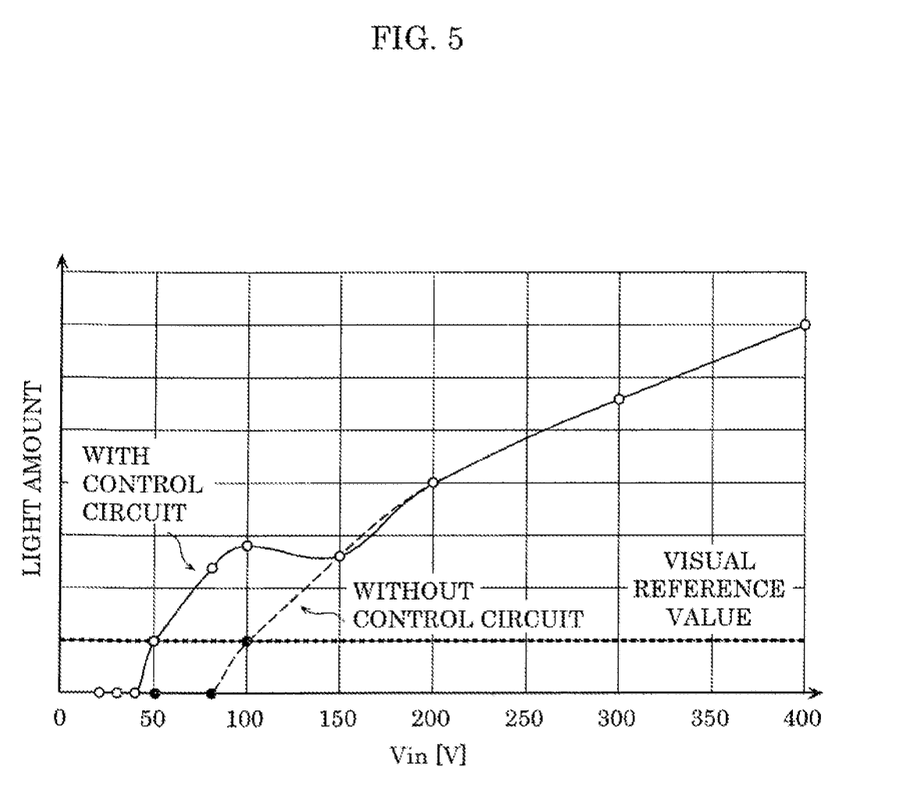
FIG. 5 is a graph illustrating relationship between the potential of the power source Vin and the light amount of a light-emitting element, in Embodiment 1.

FIG. 5 is a graph illustrating relationship between the potential of the power source Vin with respect to the ground GND and the light amount of light-emitting element 10 in lighting control circuit 1 and lighting control circuit 1000.

As illustrated in FIG. 5, in lighting control circuit 1000 of a conventional type (corresponding to "without control circuit" in FIG. 5), the light amount of light-emitting element 10 monotonously decreases following the reduction in the potential of the power source Vin with respect to the ground GND and the light amount of light-emitting element 10 falls below a visual reference value when the potential of the power source Vin with respect to the ground GND falls below 100V.

On the contrary, in lighting control circuit 1 (corresponding to "with control circuit" in FIG. 5), as is the case with lighting control circuit 1000, the light amount of light-emitting element 10 monotonously decreases until the potential of the power source Vin with respect to the ground GND falls below 150V following the reduction in the aforementioned potential. On the other hand, when the potential of the power source Vin with respect to the ground GND falls below 150V, the amount of the current flowing to light-emitting element 10 increases once. Thus, the light amount of light-emitting element 10 increases once. Then the light amount of light-emitting element 10 is continuously kept at a value over the visual reference value up to approximately 50V.

As described above, unlike lighting control circuit 1000 of a conventional type, lighting control circuit 1 according to Embodiment 1 can keep the light amount of light-emitting element 10 greater than or equal to the visual reference value until the potential of the power source Vin with respect to the ground GND becomes lower.

Specifically, compared to a conventional case, lighting control circuit 1 according to Embodiment 1 can reduce a voltage applied to light-emitting element 10 as a result of a reduction in a voltage applied to a light-emitting circuit to thereby suppress a decrease in the amount of light emitted from light-emitting element 10.

Embodiment 2

Hereinafter, a lighting control circuit according to Embodiment 2 obtained by changing part of a configuration of lighting control circuit 1 according to Embodiment 1 will be described.

Figure 6:
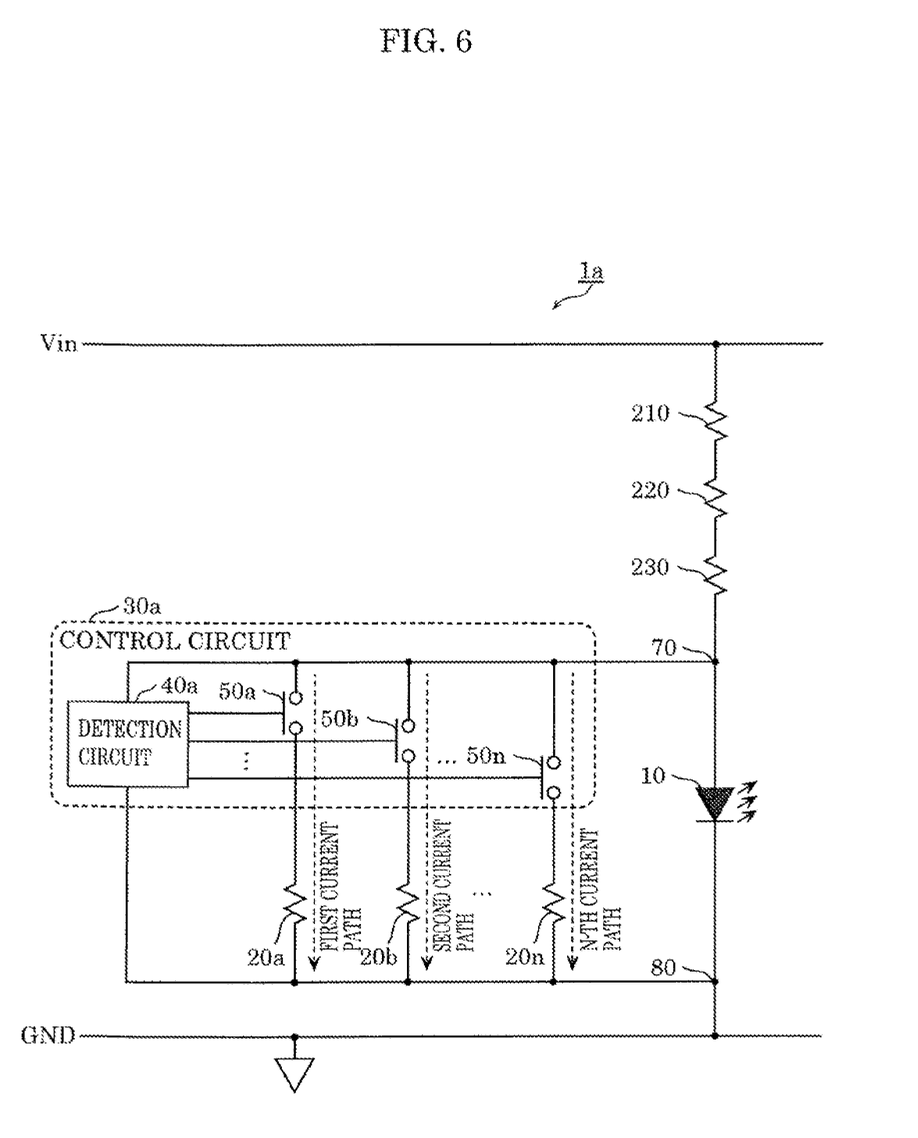
FIG. 6 is a circuit diagram illustrating a configuration of a lighting control circuit according to Embodiment 2.

FIG. 6 is a circuit diagram illustrating a configuration of lighting control circuit 1a according to Embodiment 2.

As illustrated in FIG. 6, lighting control circuit 1a includes control circuit 30a in place of control circuit 30 of lighting control circuit 1 according to Embodiment 1 and n shunt resistance elements (where n is an integer of 2 or greater and FIG. 6 illustrates a case where n is three or greater) in place of first shunt resistance element 20 of lighting control circuit 1 according to Embodiment 1. Three shunt resistance elements including first shunt resistance element 20a, second shunt resistance element 20b, and n-th shunt resistance element 20n will be described here as representatives of the n shunt resistance elements. Note that n is illustrated as if it were 3 or greater in FIG. 6, but n may be 2. Even when n is 2, lighting control circuit 1a is formed without including n-th shunt resistance element 20n and n-th switch 50n (to be described later on).

Hereinafter, the configuration of lighting control circuit 1a will be described focusing on a difference from lighting control circuit 1 according to Embodiment 1.

First shunt resistance element 20a is connected in parallel to light-emitting element 10 between first terminal 70 and second terminal 80. Second shunt resistance element 20b is connected in parallel to light-emitting element 10 and first shunt resistance element 20a between first terminal 70 and second terminal 80. N-th shunt resistance element 20n is connected in parallel to light-emitting element 10, first shunt resistance element 20a, and second shunt resistance element 20b between first terminal 70 and second terminal 80. First shunt resistance element 20a, second shunt resistance element 20b, and n-th shunt resistance element 20n are typically resistance elements each having a resistance value of several kilo ohms to several tens of kilo ohms.

When a potential difference between first terminal 70 and second terminal 80 is greater than a first threshold value, control circuit 30a turns, into a conducting state, a first current path extending between first terminal 70 and second terminal 80 via first shunt resistance element 20a. When the potential difference between first terminal 70 and second terminal 80 is smaller than the first threshold value, control circuit 30a turns, into a non-conducting state, the first current path extending between first terminal 70 and second terminal 80 via first shunt resistance element 20a. Moreover, when the potential difference between first terminal 70 and second terminal 80 is greater than a second threshold value different from the first threshold value, control circuit 30a turns, into a conducting state, a second current path extending between first terminal 70 and second terminal 80 via second shunt resistance element 20b. When the potential difference between first terminal 70 and second terminal 80 is smaller than the second threshold value, control circuit 30a turns, into a non-conducting state, the second current path extending between first terminal 70 and second terminal 80 via second shunt resistance element 20b. Moreover, when the potential difference between first terminal 70 and second terminal 80 is greater than an n-th threshold value different from the first threshold value and the second threshold value, control circuit 30a turns, into a conducting state, an n-th current path extending between first terminal 70 and second terminal 80 via n-th shunt resistance element 20n. When the potential difference between first terminal 70 and second terminal 80 is smaller than the n-th threshold value, control circuit 30a turns, into a non-conducting state, the n-th current path extending between first terminal 70 and second terminal 80 via n-th shunt resistance element 20n.

As illustrated in FIG. 6, control circuit 30a includes detection circuit 40a and n switches. Here, n refers to a switch, and a description will be given referring to three switches including first switch 50a, second switch 50b, and n-th switch 50n as representatives, as is the case with the n shunt resistance elements.

First switch 50a is a switch which switches between a first state as a conducting state and a second state as a non-conducting state and is serially connected to first shunt resistance element 20a on the first current path.

Second switch 50b is a switch which switches between a third state as a conducting state and a fourth state as a non-conducting state and is serially connected to second shunt resistance element 20b on the second current path.

N-th switch 50n is a switch which switches between a fifth state as a conducting state and a sixth state as a non-conducting state and is serially connected to n-th shunt resistance element 20n on the n-th current path.

Detection circuit 40a detects the potential difference between first terminal 70 and second terminal 80. Then detection circuit 40a turns first switch 50a into the first state when the detected potential difference is greater than the first threshold value and turns first switch 50a into the second state when the detected potential difference is smaller than the first threshold value. Detection circuit 40a turns second switch 50b into the third state when the detected potential difference is greater than the second threshold value and turns second switch 50b into the fourth state when the detected potential difference is smaller than the second threshold value. Detection circuit 40a turns n-th switch 50n into the fifth state when the detected potential difference is greater than the n-th threshold value and turns n-th switch 50n into the sixth state when the detected potential difference is smaller than the n-th threshold value.

Hereinafter, the operation of lighting control circuit 1a with the aforementioned configuration will be described.

The following description is based on the assumption that the potential differences between first terminal 70 and second terminal 80 will be the first threshold value, the second threshold value, and the n-th threshold value, respectively when the potentials of the power source Vin with respect to the ground GND are 300V, 200V, and 100V. The following description is also based on the assumption that detection circuit 40a turns first switch 50a into the first state (conducting state) when the potential difference between first terminal 70 and second terminal 80 is greater than or equal to the first threshold value and turns first switch 50a into the second state (non-conducting state) when the potential difference between first terminal 70 and second terminal 80 is less than the first threshold value. Detection circuit 40a turns second switch 50b into the third state (conducting state) when the potential difference between first terminal 70 and second terminal 80 is greater than or equal to the second threshold value and turns second switch 50b into the fourth state (non-conducting state) when the potential difference between first terminal 70 and second terminal 80 is less than the second threshold value. Detection circuit 40a turns n-th switch 50n into the fifth state (conducting state) when the potential difference between first terminal 70 and second terminal 80 is greater than or equal to the n-th threshold value and turns n-th switch 50n into the sixth state (non-conducting state) when the potential difference between first terminal 70 and second terminal 80 is less than the n-th threshold value.

In lighting control circuit 1a, when the potential of the power source Vin with respect to the ground GND is 300V or greater, the potential difference between first terminal 70 and second terminal 80 is greater than or equal to the first threshold value, greater than or equal to the second threshold value, and greater than or equal to the n-th threshold value, which therefore turns first switch 50a, second switch 50b, and n-th switch 50n into a conducting state. Thus, a main current between first terminal 70 and second terminal 80 flows while divided into four current paths including a current path (that is, the first current path) passing through first switch 50a and first shunt resistance element 20a, a current path (that is, the second current path) passing through second switch 50b and second shunt resistance element 20b, a current path (that is, the n-th current path) passing through n-th switch 50n and n-th shunt resistance element 20n, and a current path passing through light-emitting element 10.

In lighting control circuit 1a, when the potential of the power source Vin with respect to the ground GND is 200V or greater and less than 300V, the potential difference between first terminal 70 and second terminal 80 is less than the first threshold value, greater than or equal to the second threshold value, and greater than or equal to the n-th threshold value, which therefore turns first switch 50a into a non-conducting state and turns second switch 50b and n-th switch 50n into a conducting state. Thus, the main current between first terminal 70 and second terminal 80 flows while divided into three current paths including a current path (that is, the second current path) passing through second switch 50b and second shunt resistance element 20b, a current path (that is, the n-th current path) passing through n-th switch 50n and n-th shunt resistance element 20n, and a current path passing through light-emitting element 10.

Therefore, when transition occurs from a state in which the potential of the power source Vin with respect to the ground GND is 300V or greater to a state in which the potential of the power source Vin with respect to the ground GND is less than 300V, the amount of the current flowing to light-emitting element 10 increases more in the state after the transition than in the state before the transition. That is, the light amount of light-emitting element 10 increases more in the state after the transition than in the state before the transition.

In lighting control circuit 1a, when the potential of the power source Vin with respect to the ground GND is 100V or greater and less than 200V, the potential difference between first terminal 70 and second terminal 80 is less than the first threshold value, less than the second threshold value, and greater than or equal to the n-th threshold value, which therefore turns first switch 50a and second switch 50b into a non-conducting state and turns n-th switch 50n into a conducting state. Thus, the main current between first terminal 70 and second terminal 80 flows while divided into two current paths including a current path (that is, the n-th current path) passing through n-th switch 50n and n-th shunt resistance element 20n and a current path passing through light-emitting element 10.

Therefore, when transition occurs from a state in which the potential of the power source Vin with respect to the ground GND is 200V or greater to a state in which the potential of the power source Vin with respect to the ground GND is less than 200V, the amount of the current flowing to light-emitting element 10 increases more in the state after the transition than in the state before the transition. That is, the light amount of light-emitting element 10 increases more in the state after the transition than in the state before the transition.

Figure 7:
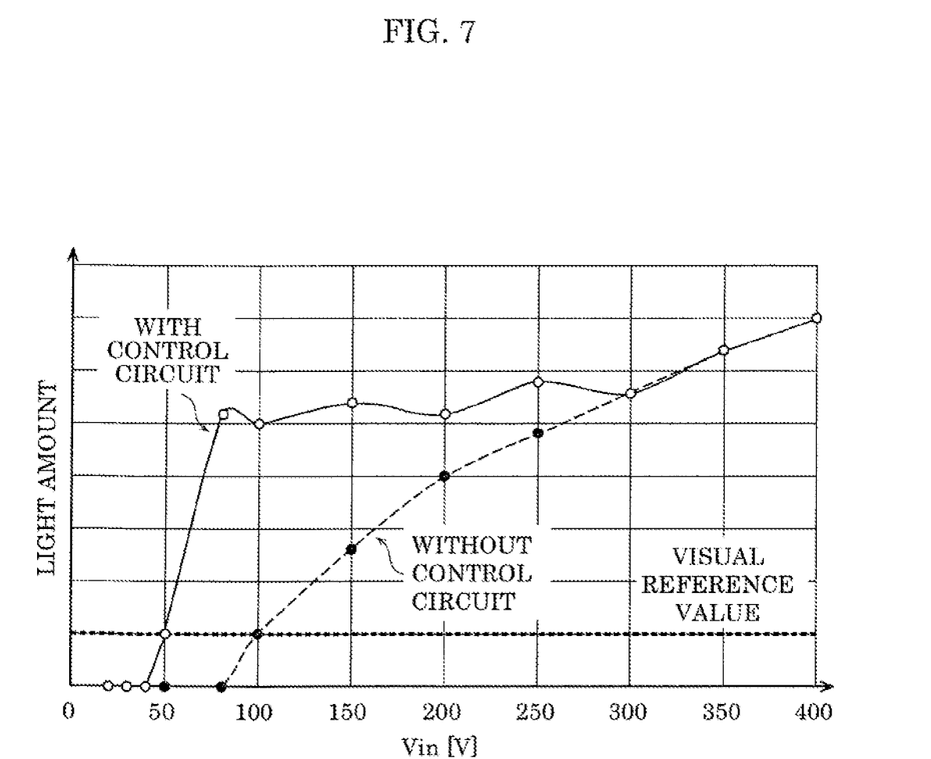
FIG. 7 is a graph illustrating relationship between the potential of the power source Vin and the light amount of a light-emitting element, in Embodiment 1.

FIG. 7 is a graph illustrating relationship between the potential of the power source Vin with respect to the ground GND and the light amount of light-emitting element 10 in lighting control circuit 1a and lighting control circuit 1000 of a conventional type in the comparative example (see FIG. 5, etc., in Embodiment 1).

As illustrated in FIG. 7, in lighting control circuit 1000 of a conventional type (corresponding to "Without control circuit" in FIG. 7), the light amount of light-emitting element 10 monotonously decreases following a reduction in the potential of the power source Vin with respect to the ground GND and the light amount of light-emitting element 10 falls below a visual reference value when the potential of the power source Vin with respect to the ground GND falls below 100V, as described in Embodiment 1.

On the contrary, as is the case with lighting control circuit 1000, the light amount of light-emitting element 10 monotonously decreases until a fall below 300V occurs following the reduction in the potential of the power source Vin with respect to the ground GND in lighting control circuit 1a (corresponding to "With control circuit" in FIG. 7). On the other hand, when the potential of the power source Vin with respect to the ground GND falls below 300V, the amount of the current flowing to light-emitting element 10 increases once. Thus, the light amount of light-emitting element 10 increases once. Moreover, when the potential of the power source Vin with respect to the ground GND falls below 200V, the amount of the current flowing to light-emitting element 10 increases once again. Thus, the light amount of light-emitting element 10 increases once again. Moreover, when the potential of the power source Vin with respect to the ground GND falls below 100V, the amount of the current flowing to light-emitting element 10 increases once again. Thus, the light amount of light-emitting element 10 increases once again. Then the light amount of light-emitting element 10 is kept at a value over the visual reference value until approximately 50V is reached.

As described above, compared to lighting control circuit 1000 of a conventional type, in lighting control circuit 1a according to Embodiment 2, the light amount of light-emitting element 10 can be kept greater than or equal to the visual reference value until the potential of the power source Vin with respect to the ground GND becomes lower.

Specifically, with lighting control circuit 1a according to Embodiment 2, it is possible to reduce the voltage applied to light-emitting element 10 as a result of the reduction in the voltage applied to the light-emitting circuit to thereby suppress a decrease in the amount of the light emitted from light-emitting element 10 more than in a conventional case.

Other Embodiments

The lighting control circuits according to the present invention have been described above, referring to Embodiment 1 and Embodiment 2, but the present invention is not limited to the aforementioned embodiments. Those obtained by making modifications conceivable by those skilled in the art to the present embodiments described above and a mode configured by combining together the components in the different embodiments are also included in the scope of the present invention without departing from the spirits of the present invention.

Hereinafter, still other examples of the present disclosure will be listed.

(1) It has been described that control circuit 30 in Embodiment 1 includes first switch 50 and detection circuit 40. However, as long as control circuit 30 can realize a function similar to the function described in Embodiment 1, the circuit configuration of control circuit 30 does not have to be limited to an example where control circuit 30 is realized with a circuit configuration as described in Embodiment 1 and may be realized with any circuit configuration.

As another example of the lighting control circuit according to the present disclosure, a lighting control circuit according to Variation 1 including a circuit configuration different from that of control circuit 30 will be illustrated.

Figure 8:
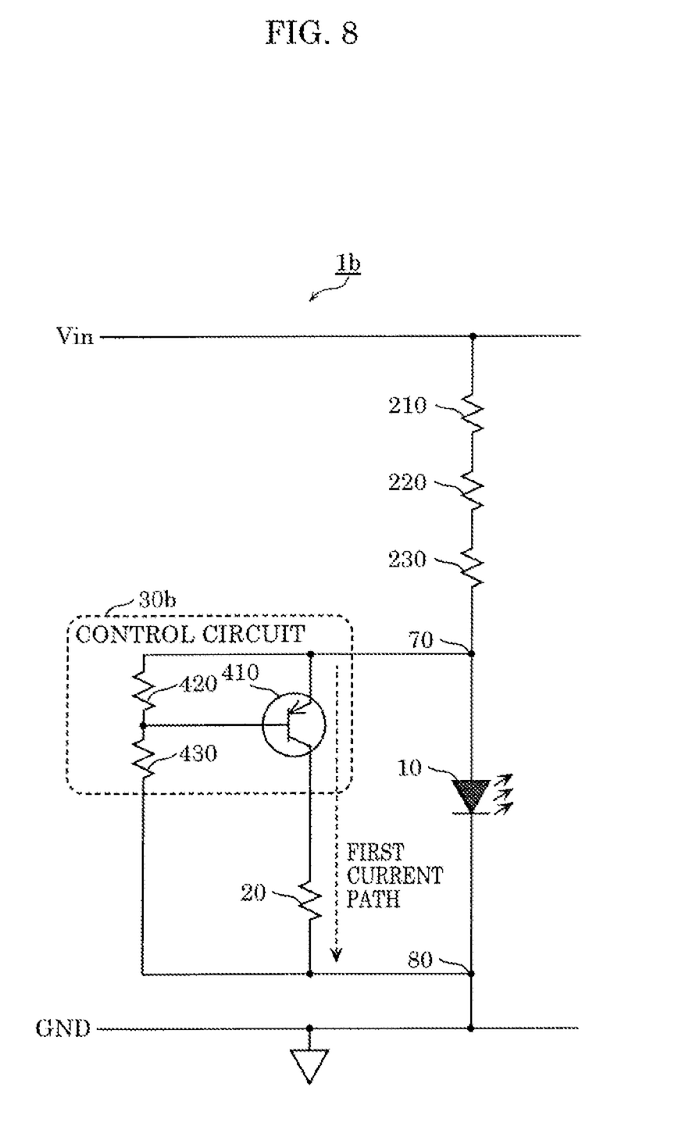
FIG. 8 is a circuit diagram illustrating a configuration of a lighting control circuit according to Variation 1.

FIG. 8 is a circuit diagram illustrating the configuration of lighting control circuit 1b according to Variation 1.

As illustrated in FIG. 8, lighting control circuit 1b includes control circuit 30b in place of control circuit 30 of lighting control circuit 1 according to Embodiment 1.

Then control circuit 30b includes control transistor 410, first control resistance element 420, and second control resistance element 430.

Control circuit 30b can achieve the following by setting the resistance value of first control resistance element 420 and the resistance value of second control resistance element 430 at appropriate values. Control circuit 30b can turn, into a conducting state, a first current path extending between first terminal 70 and second terminal 80 via first shunt resistance element 20 when the potential difference between first terminal 70 and second terminal 80 is greater than the first threshold value. Control circuit 30b can turn, into a non-conducting state, the first current path extending between first terminal 70 and second terminal 80 via first shunt resistance element 20 when the potential difference between first terminal 70 and second terminal 80 is smaller than the first threshold value.

(2) The lighting control circuit according to the present disclosure may include, in part of the components thereof, a shared element also usable in another circuit.

As another example of the lighting control circuit according to the present disclosure, a lighting control circuit according to Variation 2 will be illustrated below which includes, in part of the components thereof, a shared element also commonly usable in another circuit.

Figure 9:
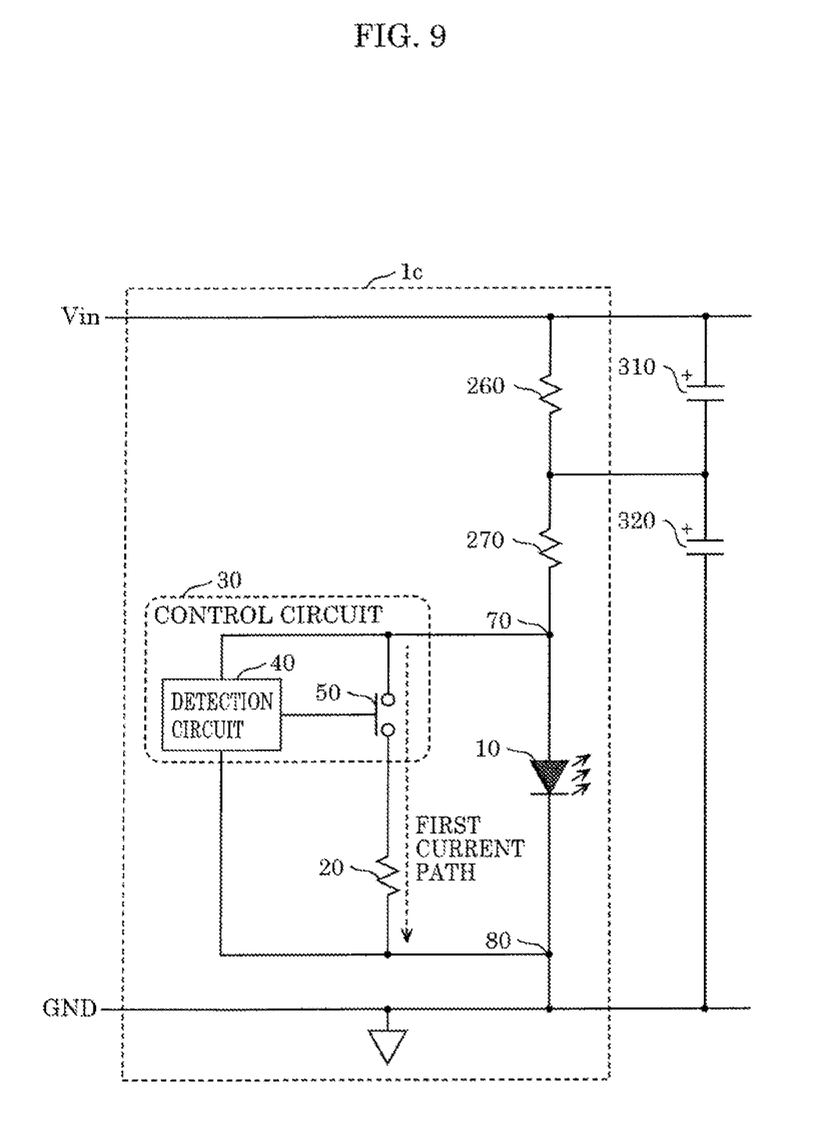
FIG. 9 is a circuit diagram illustrating a configuration of a lighting control circuit according to Variation 2.

FIG. 9 is a circuit diagram illustrating the configuration of lighting control circuit 1c according to Variation 2.

As illustrated in FIG. 9, lighting control circuit 1c includes first balance resistance element 260 and second balance resistance element 270 in place of current limiting resistance element 210 to current limiting resistance element 230 of lighting control circuit 1 according to Embodiment 1.

In a power source smoothening circuit (an overall circuit image thereof is not illustrated) which uses the power source Vin and the ground GND as a power source and a ground common to those of lighting control circuit 1c, first balance resistance element 260 and second balance resistance element 270 are also used as balance resistance elements used together with smoothening capacitor 310 and smoothening capacitor 320.

As described above, lighting control circuit 1c includes first balance resistance element 260 and second balance resistance element 270 as the shared elements also commonly used in a power source smoothening circuit as a different circuit, thereby making it possible to realize a reduction in the total number of elements in lighting control circuit 1c and the power source smoothening circuit. Thus, it is possible to realize downsizing and cost reduction of a device including lighting control circuit 1c and the power source smoothening circuit.

INDUSTRIAL APPLICABILITY

The present invention is widely usable for lighting control circuits which control a lighting state.

REFERENCE MARKS IN THE DRAWINGS 1, 1a, 1b, 1c lighting control circuit
10 light-emitting element
20, 20a first shunt resistance element
20b second shunt resistance element
20n n-th shunt resistance element
30, 30a, 30b control circuit
40, 40a detection circuit
50, 50a first switch
50b second switch
50n n-th switch
70 first terminal
80 second terminal
210, 211, 220, 221, 230, 231 current limiting resistance element

The invention claimed is:

1. A lighting control circuit, comprising:
a light-emitting element which includes a first terminal and a second terminal;
a first shunt resistance element which is connected in parallel to the light-emitting element between the first terminal and the second terminal;
a control circuit which turns, into a conducting state, a first current path extending between the first terminal and the second terminal via the first shunt resistance element when a potential difference between the first terminal and the second terminal is greater than a first threshold value and turns, into a non-conducting state, the first current path when the potential difference is smaller than the first threshold value; and
a second shunt resistance element which is connected in parallel to the light-emitting element and the first shunt resistance element between the first terminal and the second terminal,
wherein the control circuit turns, into a conducting state, a second current path extending between the first terminal and the second terminal via the second shunt resistance element when the potential difference between the first terminal and the second terminal is greater than a second threshold value different from the first threshold value and the control circuit turns the second current path into a non-conducting state when the potential difference is smaller than the second threshold value.

2. The lighting control circuit according to claim 1, wherein the control circuit includes: a detection circuit which detects the potential difference; and a first switch which is serially connected to the first shunt resistance element on the first current path and switches between a first state as a conducting state and a second state as a non-conducting state, and
the detection circuit turns the first switch into the first state when the potential difference is greater than the first threshold value and turns the first switch into the second state when the potential difference is smaller than the first threshold value.

3. The lighting control circuit according to claim 1, wherein the control circuit includes: a detection circuit which detects the potential difference; a first switch which is serially connected to the first shunt resistance element on the first current path and switches between a first state as a conducting state and a second state as a non-conducting state; and a second switch which is serially connected to the second shunt resistance element on the second current path and switches between a third state as a conducting state and a fourth state as a non-conducting state, and
the detection circuit turns the first switch into the first state when the potential difference is greater than the first threshold value and turns the first switch into the second state when the potential difference is smaller than the first threshold value, and the detection circuit turns the second switch into the third state when the potential difference is greater than the second threshold value and turns the second switch into the fourth state when the potential difference is smaller than the second threshold value.

4. The lighting control circuit according to claim 1, wherein the second threshold value is smaller than the first threshold value.

* * * * *